(12) United States Patent
Park et al.

(10) Patent No.: US 10,544,038 B2
(45) Date of Patent: Jan. 28, 2020

(54) MEMS MICROPHONE AND METHOD OF MANUFACTURING THE SAME

(71) Applicant: DB HITEK CO., LTD., Gangnam-gu Seoul (KR)

(72) Inventors: Dong Chun Park, Incheon (KR); Jong Won Sun, Gyeonggi-do (KR)

(73) Assignee: DB HITEK CO., LTD., Seoul (KR)

( * ) Notice: Subject to any disclaimer, the term of this patent is extended or adjusted under 35 U.S.C. 154(b) by 0 days.

(21) Appl. No.: 16/056,840

(22) Filed: Aug. 7, 2018

(65) Prior Publication Data
US 2019/0047849 A1 Feb. 14, 2019

(30) Foreign Application Priority Data
Aug. 9, 2017 (KR) .................. 10-2017-0100992

(51) Int. Cl.
| H01L 21/02 | (2006.01) |
| B81C 1/00 | (2006.01) |
| B81B 7/00 | (2006.01) |
| H04R 19/00 | (2006.01) |
| H04R 19/04 | (2006.01) |

(52) U.S. Cl.
CPC ........ B81C 1/00158 (2013.01); B81B 7/0032 (2013.01); H01L 21/02518 (2013.01); H04R 19/005 (2013.01); B81B 2201/0257 (2013.01); B81B 2203/0127 (2013.01); H04R 19/04 (2013.01)

(58) Field of Classification Search
CPC ......... H01L 21/02296; H01L 21/02518; H01L 21/64; H01L 29/66007
See application file for complete search history.

(56) References Cited

U.S. PATENT DOCUMENTS

| 2010/0065930 A1* | 3/2010 | Nakatani ............ B81C 1/00476 257/415 |
| 2014/0374859 A1* | 12/2014 | Kasai .................. H04R 19/005 257/419 |
| 2017/0212070 A1 | 7/2017 | Lee et al. |
| 2017/0234821 A1 | 8/2017 | Lee et al. |
| 2017/0311083 A1 | 10/2017 | Sun et al. |
| 2017/0311089 A1 | 10/2017 | Sun et al. |

FOREIGN PATENT DOCUMENTS

| KR | 1020080052222 A | 6/2008 |
| KR | 1020100073051 A | 7/2010 |
| KR | 101462375 B1 | 11/2014 |
| KR | 101578542 B1 | 12/2015 |

OTHER PUBLICATIONS

U.S. Appl. No. 16/056,863, filed Aug. 7, 2018, Inventor(s): Sun.

* cited by examiner

*Primary Examiner* — Cheung Lee
(74) *Attorney, Agent, or Firm* — Patterson Thuente Pedersen, PA

(57) ABSTRACT

A MEMS microphone includes a substrate having a cavity, a back plate provided over the substrate and having a plurality of acoustic holes, a diaphragm disposed between the substrate and the back plate, and spaced apart from the substrate and the back plate, a strut located at outer side of the diaphragm, having a lower surface in contact with an upper surface of the substrate and being integrally formed with the upper insulation layer to support the upper insulation layer to space the upper insulation layer from the diaphragm, and a bending prevention member provided on an upper surface of the back plate for preventing the back plate from being bent.

18 Claims, 11 Drawing Sheets

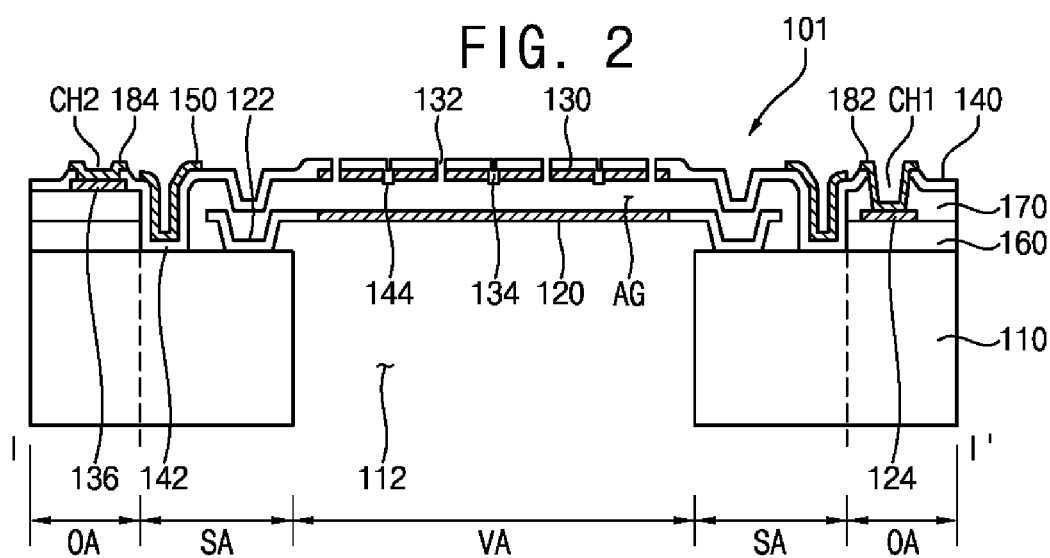
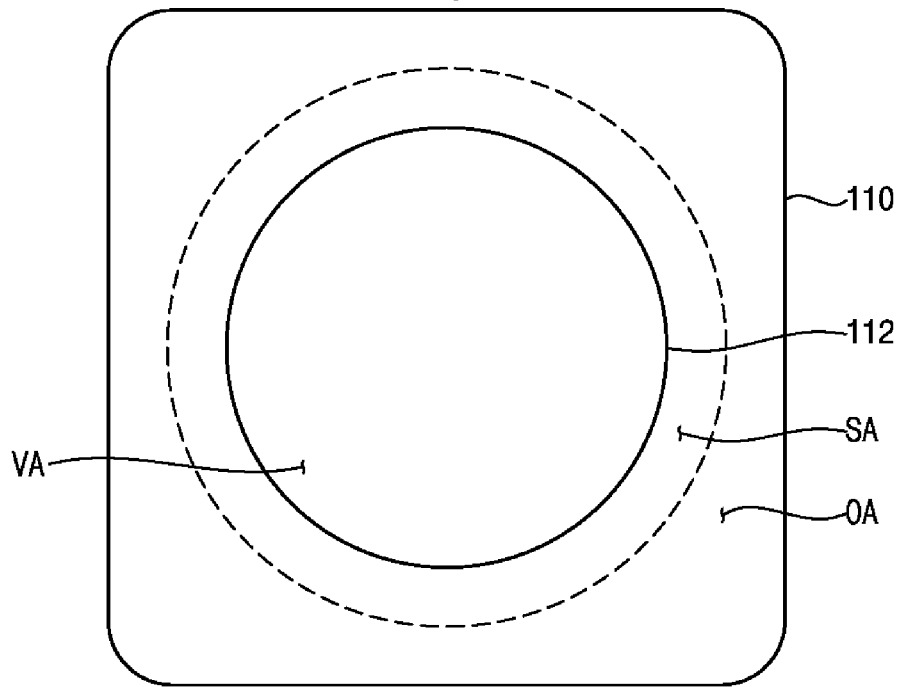

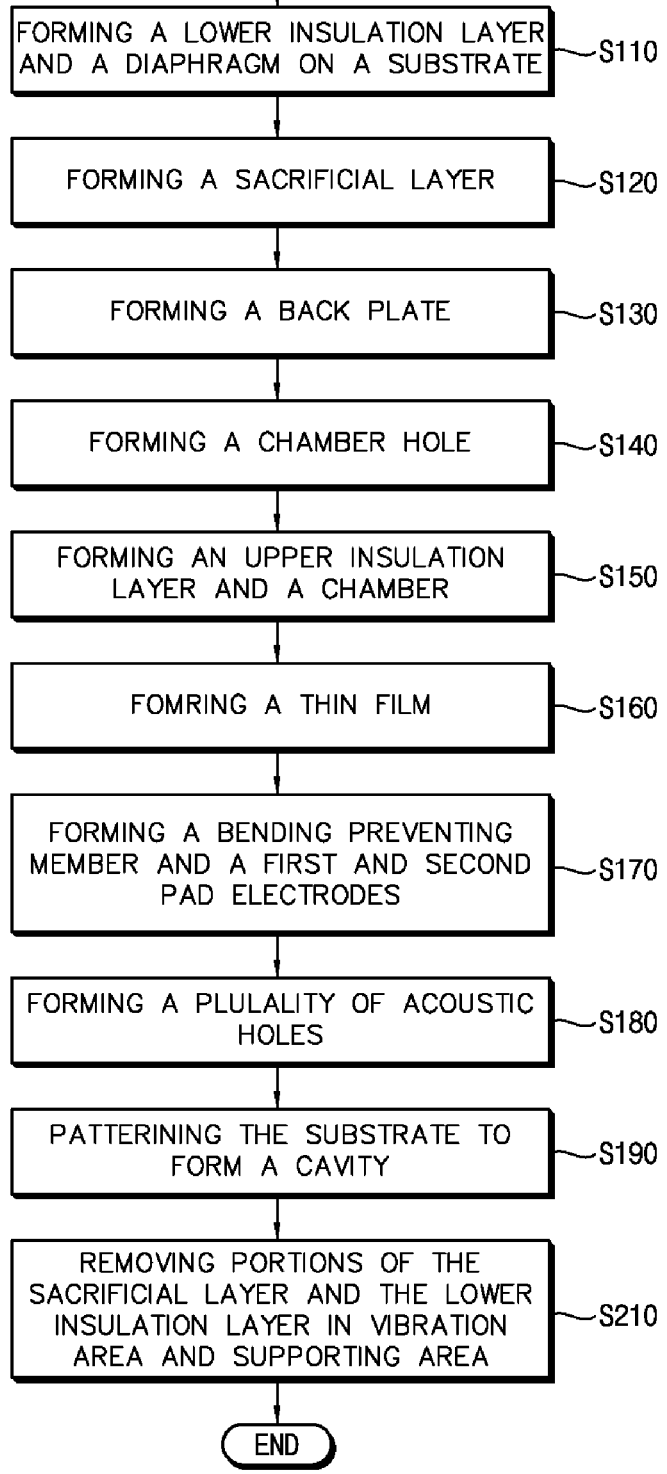

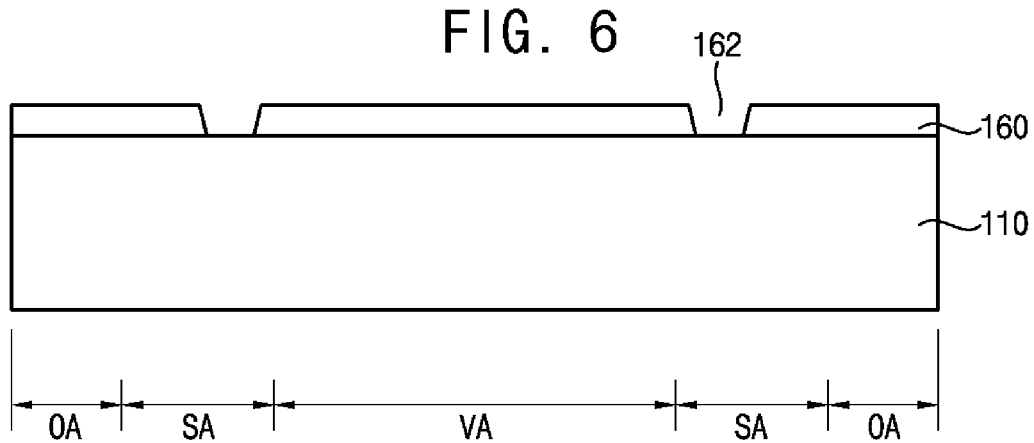
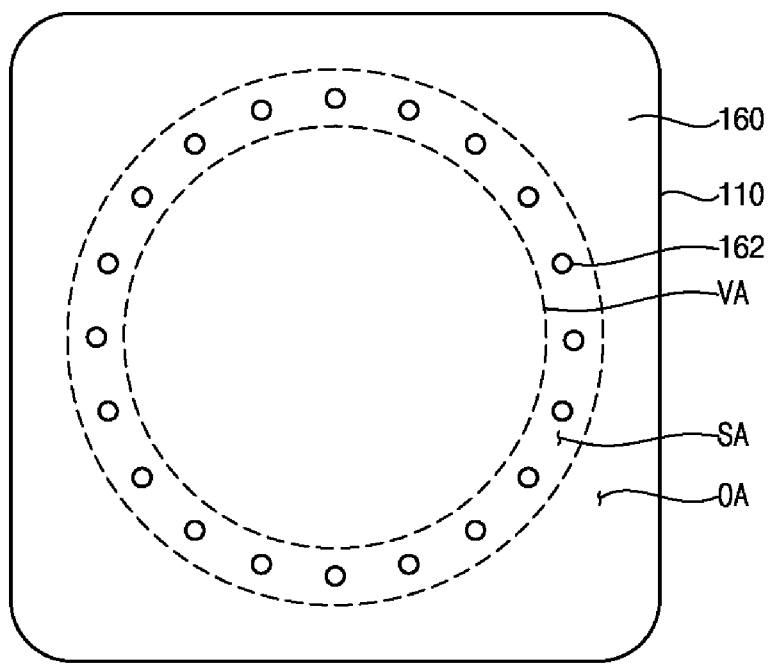

MEMS MICROPHONE AND METHOD OF MANUFACTURING THE SAME

CROSS-REFERENCE TO RELATED APPLICATION

This application claims priority to Korean Patent Application No. 10-2017-0100992, filed on Aug. 9, 2017 and all the benefits accruing therefrom under 35 U.S.C. § 119, the contents of which are incorporated by reference in their entirety.

TECHNICAL FIELD

The present disclosure relates to MEMS microphones capable of converting an acoustic wave into an electrical signal, and a method of manufacturing such MEMS microphones, and more particularly, to capacitive MEMS microphones being capable of transmitting signal related to an acoustic signal using a displacement which may be generated due to an acoustic pressure and a method of manufacturing such MEMS microphones.

BACKGROUND

Generally, a capacitive microphone utilizes a capacitance between a pair of electrodes which are facing each other to generate an acoustic signal. A MEMS microphone may be manufactured by a semiconductor MEMS process to have an ultra-small size.

The MEMS microphone may include a substrate including a cavity, a bendable diaphragm and a back plate which is facing the diaphragm. The diaphragm can be a membrane structure to generate a displacement due to the acoustic pressure. In particular, when the acoustic pressure is applied to the diaphragm, the diaphragm may be bent toward the back plate due to the acoustic pressure. The displacement of the diaphragm can be sensed through a change of capacitance between the diaphragm and the back plate. As a result, an acoustic wave can be converted into an electrical signal for output.

SUMMARY

In particular, a MEMS microphone should exhibit a pull-in voltage as well as an increase of capacitance when measuring capacitance-voltage (C-V) characteristics. For this purpose, only a diaphragm must be selectively bent by an applied voltage. Here, the pull-in voltage corresponds to a maximum voltage where the balance between an electrostatic force generated when a DC voltage is applied to a pair of electrodes and an elastic force to return to an initial position after the diaphragm is bent, is broken.

However, when voltage is applied to the electrodes included in the MEMS microphone, the diaphragm can be bent upward, whereas the back plate can be bent downward. In this case, only the capacitance increases but the pull-in voltage does not appear, thereby deteriorating the characteristics of the MEMS microphone.

The example embodiments of the present invention provide a MEMS microphone capable of preventing a back plate from being bent to improve pull-in voltage characteristics, and a method of manufacturing the MEMS microphone.

According to an example embodiment of the present invention, a MEMS microphone includes a substrate having a cavity, a back plate being disposed over the substrate and having a plurality of acoustic holes, a diaphragm disposed between the substrate and the back plate, the diaphragm being spaced apart from the substrate and the back plate, covering the cavity, and being configured to generate a displacement with responding to an acoustic pressure, an upper insulation layer covering the back plate and holding the back plate to space the back plate from the diaphragm to form an air gap between the back plate and the diaphragm, a strut being provided at an outer side of the diaphragm and having a lower surface making contact with an upper surface of the substrate to support the upper insulation layer and to space the upper insulation layer from the diaphragm, and a bending prevention member disposed on the strut to prevent the back plate from being bent.

In an example embodiment, the bending prevention member may have a tensile stress substantially higher than that of the upper insulation layer.

In an example embodiment, the bending prevention member may include a metal material such as aluminum.

In an example embodiment, the bending prevention member may cover an upper surface of the strut and a connection portion of connecting the strut to the upper insulation layer.

The bending prevention member may further cover a portion of an upper surface of the upper insulation layer, corresponding to a position located between the strut and the back plate.

In an example embodiment, the strut may be spaced from the diaphragm, and the strut has a ring shape to surround the diaphragm.

The bending prevention member may have a ring shape to extend along the strut.

In an example embodiment, the MEMS microphone may further include at least one anchor extending from an end portion of the diaphragm to be integrally formed with the diaphragm, the anchor having a lower surface making contact with the upper surface of the substrate to support the diaphragm.

The anchor may be formed in multiple parts, such that a plurality of anchors are spaced apart from each other to be arranged along a periphery of the diaphragm, and an empty space is formed between the anchors adjacent to each other to provide a passage through which the acoustic pressure propagates.

The strut can be positioned at an outer side of the anchors, and the anchors positioned vertically below the bending prevention member.

In an example embodiment, the MEMS microphone may further include a lower insulation layer pattern located on the substrate, below the upper insulation layer and at an outer side of the strut, the lower insulation layer pattern having a material different from that of the upper insulation layer, a diaphragm pad disposed on the lower insulation layer pattern and connected to the diaphragm, a sacrificial layer pattern interposed between the lower insulation layer pattern and the upper insulation layer and disposed at an outer side of the strut, the sacrificial layer pattern having a material different from that of the upper insulation layer, a back plate pad located on the sacrificial layer pattern and connected to the back plate, a first pad electrode disposed on the upper insulation layer to be electrically connected to the diaphragm pad, the first pad electrode being formed from the same layer as the bending prevention member, and a second pad electrode disposed on the upper insulating layer to be electrically connected to the back plate pad, the second pad electrode being formed from the same layer as the bending prevention member.

In an example embodiment, the diaphragm may include a doped portion disposed at a position corresponding to the back plate.

According to an example embodiment of the present invention, a MEMS microphone includes a substrate having a cavity, the substrate being divided into a vibration area, a supporting area surrounding the vibration area and a peripheral area surrounding the supporting area, a diaphragm disposed over the vibration area of the substrate to cover the cavity, the diaphragm being spaced apart from the substrate, and being configured to generate a displacement corresponding to an acoustic pressure, a back plate disposed over the diaphragm and in the vibration area, the back plate having a plurality of acoustic holes, an upper insulation layer covering the back plate and holding the back plate to space the back plate from the diaphragm to form an air gap between the back plate and the diaphragm, a strut being provided in the supporting area and at an outer side of the diaphragm, the strut extending from an end portion of the upper insulation layer toward the substrate to support the upper insulation layer, and a bending prevention member disposed in the supporting area to cover an upper surface of the strut, the bending prevention member having a tensile stress substantially higher than that of the upper insulation layer to prevent the back plate from being bent.

In an example embodiment, the bending prevention member may cover an upper surface of the strut and a connection portion of connecting the strut to the upper insulation layer.

In an example embodiment, the MEMS microphone may further include at least one anchor extending from an end portion of the diaphragm toward the substrate to support the diaphragm.

In an example embodiment, the MEMS microphone may further include a diaphragm pad disposed in the peripheral area and connected to the diaphragm, a back plate pad located in the peripheral area and connected to the back plate, a first pad electrode disposed on the upper insulation layer to be electrically connected to the diaphragm pad, and a second pad electrode disposed on the upper insulating layer to be electrically connected to the back plate pad.

According to an example embodiment of the present invention, a lower insulation layer and a diaphragm are sequentially formed on a substrate being divided into a vibration area, a supporting area surrounding the vibration area, and a peripheral area surrounding the supporting area, a sacrificial layer formed on the lower insulation layer to cover the diaphragm, a back plate formed on the sacrificial layer and in the vibration area, the sacrificial layer and the lower insulation layer are patterned to form a strut hole in the supporting area for forming a strut, an insulation layer formed on the sacrificial layer and patterned to form an upper insulation layer of holding the back plate and the strut of supporting the upper insulation layer, a thin film formed on the upper insulation layer and the strut, the thin film having a tensile stress higher than that of the insulation layer, the thin film patterned to form a bending prevention member to cover an upper surface of the strut, the back plate and the upper insulation layer patterned to form a plurality of acoustic holes which penetrate through the back plate and the upper insulation layer, the substrate patterned to form a cavity in the vibration area, and wherein an etching process is performed using the cavity and the acoustic holes to remove portions of the sacrificial layer and the lower insulation layer, located at positions corresponding the vibration area and the supporting area.

In an example embodiment, the bending prevention member may be formed to cover an upper surface of the strut and a connection portion of connecting the strut to the upper insulation layer.

In an example embodiment, forming the lower insulation layer and the diaphragm sequentially may include forming a first silicon layer on the lower insulation layer, and patterning the first silicon layer to form the diaphragm in the vibration area and a diaphragm pad in the peripheral area, being connected to the diaphragm, forming the back plate may include forming a second silicon layer on the sacrificial layer, and patterning the second silicon layer to form the back plate in the vibration area and a back plate pad in the peripheral area, being connected to the back plate, and forming the bending prevention member may include forming patterning the thin film to form the bending prevention member in the supporting area, the first electrode pad on the diaphragm pad, and the second electrode on the back plate pad.

In an example embodiment, prior to forming the first silicon layer, forming the lower insulation layer and the diaphragm sequentially may include patterning the lower insulation layer to form an anchor hole in the supporting area for forming an anchor, and forming the diaphragm and the diaphragm pad may include patterning the first silicon layer to form the anchor in the supporting area to support the diaphragm.

According to example embodiments of the present invention as described above, the MEMS microphone includes a bending prevention member having a tensile stress higher than that of the upper insulation layer, on the upper surface of the strut, thereby preventing deflection of the back plate without increasing the thickness of the upper insulation layer. Particularly, the bending prevention member covers not only the upper surface of the strut but also the portion of the upper insulation layer connected to the strut, which is a portion susceptible to bending in the upper insulation layer. Accordingly, the MEMS microphone can effectively prevent deflection of the upper insulation layer and the back plate, and can improve pull-in voltage characteristics.

Further, according to the embodiments of the present invention, since the bending prevention member may be formed together with the first and the second pad electrodes, while forming the first and the second pad electrodes, it is not necessary to additionally perform a thin film deposition process and a process for patterning the thin film for forming the bending prevention member. Furthermore, since the MEMS microphone can prevent the back plate from being bent by using the bending prevention member without increasing the thickness of the back plate or the upper insulation layer, it is possible to apply the upper insulation layer with a lower thickness than the conventional one. As a result, patterning of the upper insulation layer is facilitated, process time is reduced, and manufacturing cost can be reduced.

The above summary is not intended to describe each illustrated embodiment or every implementation of the subject matter hereof. The figures and the detailed description that follow more particularly exemplify various embodiments.

BRIEF DESCRIPTION OF THE DRAWINGS

Example embodiments can be understood in more detail from the following description taken in conjunction with the accompanying drawings, in which:

FIG. 2 is a cross sectional view taken along a line I-I' of FIG. 1;

FIG. 3 is a plan view illustrating a substrate shown in FIG. 2;

FIG. 5 is a flow chart illustrating a method of manufacturing a MEMS microphone in accordance with an example embodiment of the present invention;

FIGS. 6 and 8 to 17 are cross sectional views illustrating a method of manufacturing a MEMS microphone in accordance with an example embodiment of the present invention;

FIG. 7 is a plan view illustrating a lower insulation layer pattern in FIG. 6.

Figure 1:
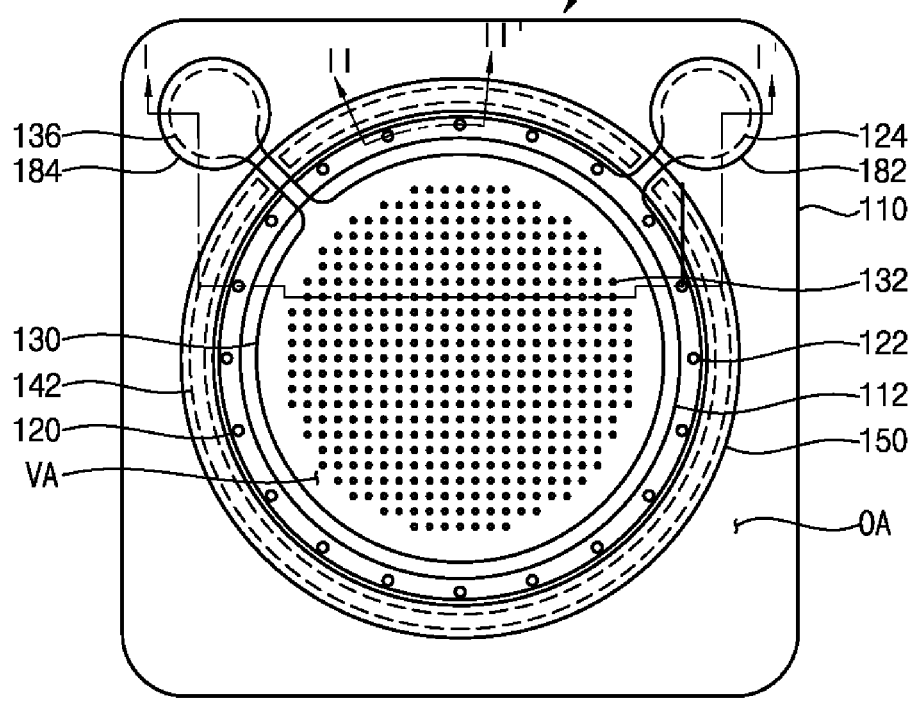
FIG. 1 is a plan view illustrating a MEMS microphone in accordance with an example embodiment of the present invention.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION OF EMBODIMENTS

Hereinafter, specific embodiments will be described in more detail with reference to the accompanying drawings. The present invention may, however, be embodied in different forms and should not be construed as limited to the embodiments set forth herein.

As an explicit definition used in this application, when a layer, a film, a region or a plate is referred to as being 'on' another one, it can be directly on the other one, or one or more intervening layers, films, regions, or plates may also be present. By contrast, it will also be understood that when a layer, a film, a region or a plate is referred to as being 'directly on' another one, it is directly on the other one, and one or more intervening layers, films, regions or plates do not exist. Also, although terms such as a first, a second, and a third are used to describe various components, compositions, regions, films, and layers in various embodiments of the present invention, such elements are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for explaining specific embodiments while not limiting the scope of the present invention. Unless otherwise defined herein, all the terms used herein, which include technical or scientific terms, may have the same meaning that is generally understood by those skilled in the art.

The depicted embodiments are described with reference to schematic diagrams of some embodiments of the present invention. Accordingly, changes in the shapes of the diagrams, for example, changes in manufacturing techniques and/or allowable errors, are sufficiently expected. The Figures are not necessarily drawn to scale. Accordingly, embodiments of the present invention are not described as being limited to specific shapes of areas described with diagrams and include deviations in the shapes and also the areas described with drawings are entirely schematic and their shapes do not represent accurate shapes and also do not limit the scope of the present invention.

Figure 4:
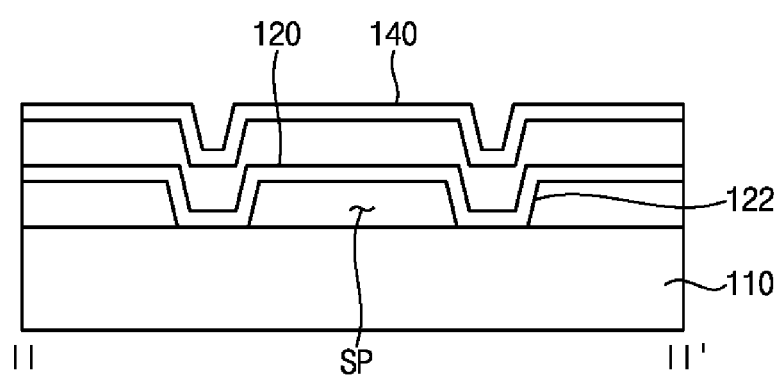
FIG. 4 is a cross sectional view taken along a line II-II' of FIG. 1.

FIG. 1 is a plan view illustrating a MEMS microphone in accordance with an example embodiment of the present invention. FIG. 2 is a cross sectional view taken along a line I-I' of FIG. 1. FIG. 3 is a plan view illustrating a substrate in FIG. 2. FIG. 4 is a cross sectional view taken along a line II-II' of FIG. 1.

Referring to FIGS. 1 to 3, a MEMS microphone 101 in accordance with an example embodiment of the present invention is capable of creating a displacement with responding to an acoustic pressure to convert an acoustic wave into an electrical signal and output the electrical signal. The MEMS microphone 101 includes a substrate 110, a diaphragm 120, a back plate 130, an upper insulation layer 140, a strut 142 and a bending prevention member 150.

As shown in FIG. 3, the substrate 110 is divided into a vibration area VA, a supporting area SA surrounding the vibration area VA, and a peripheral area OA surrounding the peripheral area SA. In the vibration area VA of the substrate 110, a cavity 112 is formed. The cavity 112 may have a cylindrical shape.

In an example embodiment, the cavity 112 may be formed in the vibration area VA to have a shape and a size corresponding to those of the vibration area VA.

The diaphragm 120 is disposed over the substrate 110. The diaphragm 120 may have a membrane structure. The diaphragm 120 may cover the cavity 112 to be exposed to an ambient environment through the cavity 112. The diaphragm 120 is spaced apart from the substrate 110 to be bendable in response to an applied acoustic pressure.

In an example embodiment, the diaphragm 120 may have a shape of a circular disc, as shown in FIG. 1.

The MEMS microphone 101 may further include at least one anchor 122 for supporting the diaphragm 120. The anchor 122 is positioned at an end portion of the diaphragm 120 and in the supporting area SA of the substrate 110. The anchor 122 may extend from an outer periphery of the diaphragm 120 toward the substrate 110 to space the diaphragm 120 from the substrate 110.

In an example embodiment of the present invention, the anchor 122 may be integrally formed with the diaphragm 120. The anchor 122 may have a lower surface to make contact with an upper surface of the substrate 110.

In an example embodiment of the present invention, the anchor 122 is provided in a plural form. A plurality of anchors 122 are arranged along a periphery of the diaphragm 120 to be spaced apart from each other, as shown FIG. 1.

Referring to FIGS. 1 and 4, each of the anchors 122 may have a dot shape in a plan view, as shown in FIG. 1. As shown in FIG. 4, each of the anchors 122 may have a cylindrical shape. The anchors 122 may have a vertical section of a U-shape, respectively. In particular, an empty space may be formed between the anchors 122 adjacent to each other to provide a passage SP through which an applied acoustic pressure can pass.

Referring to FIGS. 1 to 3 again, the back plate 130 may be disposed over the diaphragm 120. The back plate 130 may be disposed in the vibration area VA to face the diaphragm 120. The back plate 130 may have a circular shape, as shown in FIG. 1. The back plate 130 may have a doped portion being doped with impurities through an ion implantation process, as the diaphragm 120 has a portion corresponding to the back plate 130 to be doped with impurities.

The upper insulation layer 140 is positioned over the substrate 110 over which the back plate 130 is positioned. The upper insulation layer 140 may cover the back plate 130. Further, the upper insulation layer 140 may hold the back plate 130. Thus, the upper insulation layer 140 may space the back plate 130 from the diaphragm 120.

As shown in FIG. 2, the back plate 130 and the upper insulation layer 140 are spaced apart from the diaphragm 120 to make the diaphragm 120 freely bendable with responding to the acoustic pressure. Thus, an air gap AG is formed between the diaphragm 120 and the back plate 130.

A plurality of acoustic holes 132 may be formed through the back plate 130 such that the acoustic wave may flow through the acoustic holes 132. The acoustic holes 132 may be provided with penetrating through the upper insulation layer 140 and the back plate 130 to communicate with the air gap AG.

The back plate 130 may include a plurality of dimple holes 134. Further, a plurality of dimples 144 may be positioned in the dimple holes 134. The dimple holes 134 may be provided with penetrating through the back plate 130. The dimples 144 may be arranged to positions at which the dimple holes 134 are formed.

The dimples 144 may prevent the diaphragm 120 from being coupled to a lower face of the back plate 130. That is, when the acoustic pressure reaches to the diaphragm 120, the diaphragm 120 can be bent in a semicircular shape toward the back plate 130, and then can return to its initial position. A bending degree of the diaphragm 120 may vary depending on a magnitude of the acoustic pressure and may be increased to such an extent that an upper surface of the diaphragm 120 makes contact with the lower surface of the back plate 130. When the diaphragm 120 is bent so much as to contact the back plate 130, the diaphragm 120 may attach to the back plate 130 and may not return to the initial position. According to example embodiments, the dimples 144 may protrude from the lower surface of the back plate 130 toward the diaphragm 120. Even when the diaphragm 164 is severely bent so much that the diaphragm 120 contacts the back plate 130, the dimples 164 may make the diaphragm 120 and the back plate 130 to be separated from each other so that the diaphragm 120 can return to the initial position.

The strut 142 is connected to the upper insulation layer 140. The strut 142 may be positioned in the supporting area SA. The strut 142 may support the upper insulation layer 140 to space the upper insulation layer 140 and the back plate 130 from the diaphragm 120. The strut 142 may extend from a periphery of the upper insulation layer 140 toward the substrate 110. As shown in FIG. 2, the strut 142 may include a lower surface to make contact with the upper surface of the substrate 110.

In an example embodiment, the strut 142 may be integrally formed with the upper insulation layer 140. The strut 142 may have a U-shaped vertical section, as shown in FIG. 2.

The strut 142 may be spaced in a radial direction from the diaphragm 120 and may be outwardly positioned away from the anchor 122, as shown in FIG. 2. The strut 142 may have a ring shape to surround the diaphragm 120. Here, a space between the strut 142 and the diaphragm 120 may function as a passage through which the acoustic pressure moves and may serve as a passage of an etchant in the manufacturing process of the MEMS microphone 101.

The bending prevention member 150 is disposed on the strut 142. The bending prevention member 150 may cover an upper surface of the strut 142.

In an example embodiment, the bending prevention member 150 may extend along the strut 142 to have a ring shape, as shown in FIG. 1.

In particular, the bending prevention member 150 may have a tensile stress higher than that of the upper insulation layer 140. Thus, the bending prevention member 150 may prevent the back plate 130 from being bent.

That is, when a voltage is applied to electrodes to make the back plate 130 bent, the MEMS microphone 101 may increase in capacitance only, but may not exhibit a pull-in voltage. Therefore, the back plate 130 may be required to remain flat regardless of whether a voltage is applied or not. Particularly, the back plate 130 may be warped due to an inherent stress which the back plate 130 has at its own. Thus, in order to prevent the back plate 130 from being bent, the diaphragm 120 and the back plate 130 may be required to have optimal inherent stress.

Further, since the stress of the specific element is closely related to the thickness thereof, the stresses of the back plate and the upper insulation layer disposed in the vibration region may be adjusted by adjusting thicknesses of the back plate 130 and the upper insulation layer 140. However, since the back plate 130 and the upper insulation layer 140 float in the air within the vibration region VA and the manufacturing process is complicated, it may be difficult to increase the thickness of the back plate 130 or the upper insulation layer 140.

Since the bending prevention member 150 has a tensile stress higher than that of the upper insulation layer 140, the supporting force of the strut 142 for supporting the upper insulation layer 140 and the back plate 130 may be improved. As a result, the back plate 130 and the upper insulation layer 140 may be prevented from being bent.

Further, as shown in FIG. 2, in addition that the bending prevention member 150 may be formed on the upper surface of the strut 142, the bending prevention member 150 may further cover a connection portion which connects the upper insulation layer 140 to the strut 142. Accordingly, the bending prevention member 150 can prevent the bending of the upper insulation layer 140 more effectively by gripping the connection portion of connecting the strut 142 to the upper insulation layer 140 once more.

In an embodiment of the present invention, the bending prevention member 150 may be made of a conductive material. In addition, the bending prevention member 150 may be made of a metal material, for example, aluminum.

Meanwhile, the MEMS microphone 101 may further include a lower insulation layer pattern 160, a diaphragm pad 124, a sacrificial layer pattern 170, a back plate pad 136, a first pad electrode 182 and a second pad electrode 184.

In particular, the lower insulation layer pattern 160 may be formed on the upper face of the substrate 110 and under the upper insulation layer 140. The lower insulation layer pattern 160 may be located in the peripheral region OA.

The diaphragm pad 124 may be formed on an upper surface of the lower insulation layer pattern 160. The diaphragm pad 124 may be located in the peripheral region OA. The diaphragm pad 124 may be electrically connected to the diaphragm 120 and may be doped with impurities. Though not shown in detail in figures, a connection portion may be doped with impurities to connect the doped portion of the diaphragm 120 to the diaphragm pad 124.

The sacrificial layer pattern 170 may be formed on the lower insulation layer 160 on which the diaphragm pad 124 is formed, and under the upper insulation layer 140. As shown in FIG. 2, the lower insulation layer pattern 160 and the sacrificial layer pattern 170 are located in the peripheral region OA, and are disposed outer side from the strut 142. Further, the lower insulation layer pattern 160 and the sacrificial layer pattern 170 may be formed using a material different from that of the upper insulation layer 140.

The back plate pad 136 may be formed on an upper face of the sacrificial layer pattern 170. The back plate pad 136 may be located in the peripheral region OA. The back plate pad 136 may be electrically connected to the back plate 130 and may be doped with impurities by in ion implantation process. Though not shown in detail in figures, a connection portion may be doped with impurities to connect the back plate 130 to the back plate pad 136.

The first and the second pad electrodes 182 and 184 may be formed from the same layer of the bending prevention member 150. The first and the second pad electrodes 182 and 184 may include a material identical to that of the bending prevention member 150. The first pad electrode 182 is located over the diaphragm pad 124 to make contact with the diaphragm pad 124. On the other hand, the second pad electrode 184 is located over the back plate pad 136 to make contact with the back plate pad 136. As shown in FIG. 2, a first contact hole CH1 is formed by penetrating through the upper insulation layer 140 and the sacrificial layer pattern 160 to expose the diaphragm pad 124, and the first pad electrode 182 makes contact with the diaphragm pad 124 exposed by the first contact hole CH1. Further, a second contact hole CH2 is formed by penetrating through the upper insulating layer 140 to expose the back plate pad 136, and the second pad electrode 184 is formed in the second contact hole CH2 to make contact with the back plate pad 136 exposed by the second contact hole CH2.

As described above, the MEMS microphone 101 according to the present invention includes the bending prevention member 150 having a higher tensile stress than that of the upper insulating layer 140, disposed on the upper surface of the strut 142. The bending prevention member 150 may cover not only the upper surface of the strut 142 but also the connection portion connected to the strut 142 which is a portion of the upper insulation layer 140, susceptible to bending. Accordingly, since the supporting force of the strut 142 can be improved without increasing the thickness of the upper insulating layer 140, the back plate 130 and the upper insulating layer 140 can be more effectively prevented from being bent. As a result, the MEMS microphone 101 can improve the pull-in voltage characteristics. Also, since the upper insulation layer 140 having a relatively small thickness can be applied to the MEMS microphone 101, the upper insulation layer 140 can be easily patterned, a process time can be shortened, and a production cost can be reduced.

Hereinafter, a method of manufacturing a MEMS microphone will be described in detail with reference to the drawings.

FIG. 5 is a flow chart illustrating a method of manufacturing a MEMS microphone in accordance with an example embodiment of the present invention. FIGS. 6, 8 to 17 are cross sectional views illustrating a method of manufacturing a MEMS microphone in accordance with an example embodiment of the present invention. Here, FIG. 7 is a plan view illustrating a lower insulation layer in FIG. 6.

Referring to FIGS. 5 to 9, according to example embodiments of a method for manufacturing a MEMS microphone, a lower insulation layer 160 and a diaphragm are sequentially formed on a substrate 110 (step S110).

In particular, after forming the lower insulation layer 160 on an upper surface of the substrate 110, the lower insulation layer 160 is patterned to form a plurality of anchor holes 162 for forming anchors 122, as depicted in FIG. 6. As shown in FIG. 7, the anchor holes 152 may be arranged along a periphery of the vibration area VA to be spaced apart from each other, and may be formed in a supporting area SA.

Figure 8:
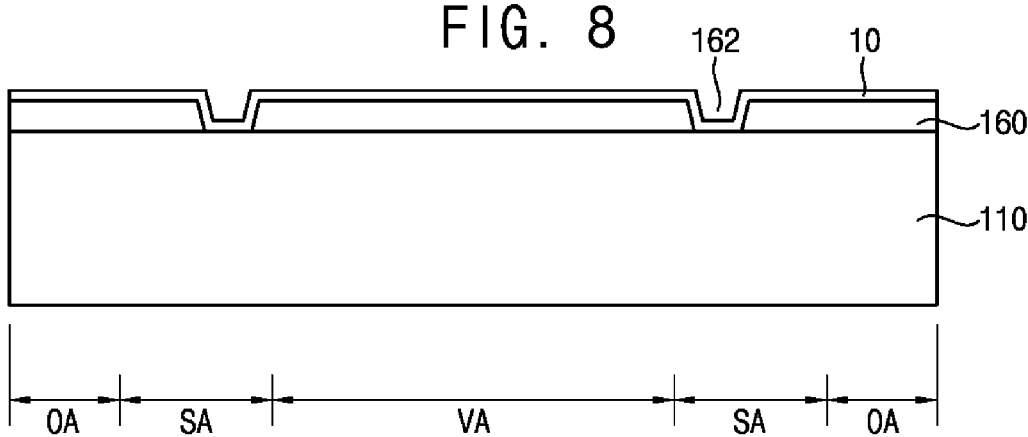

Next, as shown in FIG. 8, a first silicon layer 10 is formed on the lower insulation layer 160. The first silicon layer 10 may be formed using polysilicon.

Next, impurities may be doped into both a portion of the first silicon layer 10 positioned in the vibration region VA and a portion of the first silicon layer 10 to be subsequently transformed into a diaphragm pad 124 by performing an ion implantation process.

Figure 9:
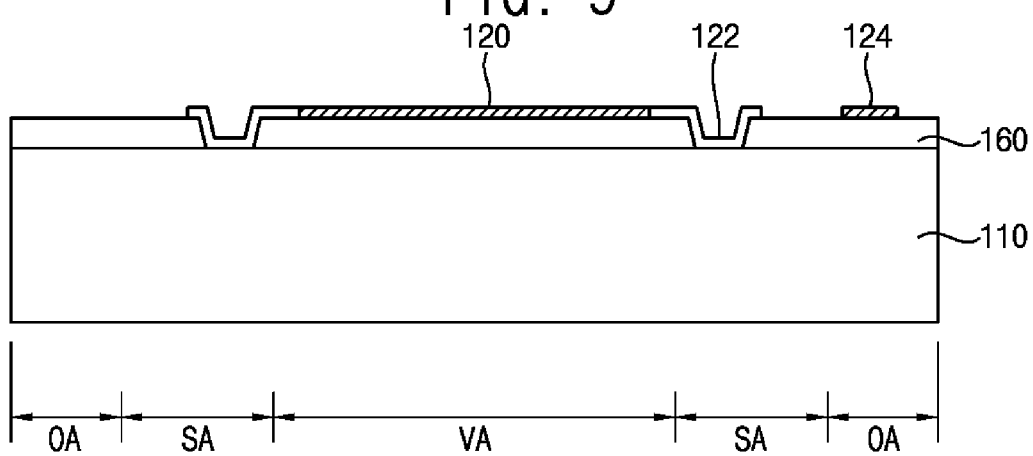

Then, the first silicon layer 10 is patterned to form a diaphragm 120, the anchors 122 and the diaphragm pad 124, as shown in FIG. 9.

Figure 10:
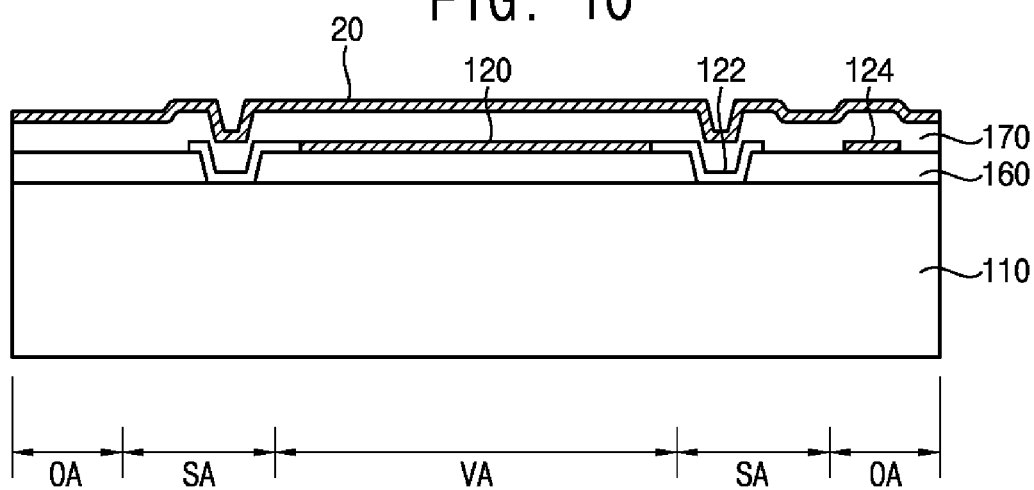
Figure 11:
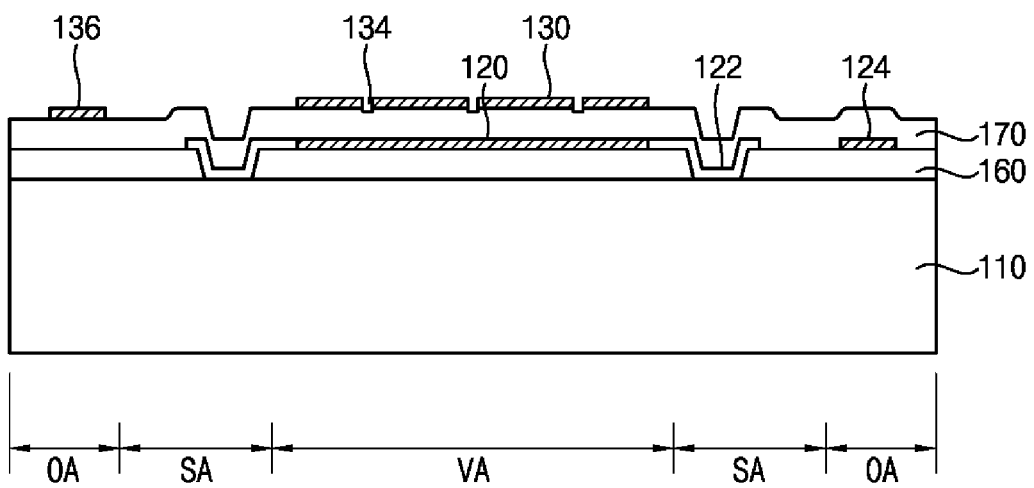

Referring to FIGS. 5, 10 and 11, a sacrificial layer 170 is formed on the lower insulation layer 160 to cover the diaphragm 120 and the diaphragm pad 124 (step S120).

Referring to FIG. 11, a back plate 130 is formed on the sacrificial layer 170 (step S130).

In particular, a second polysilicon layer 20 is formed on an upper surface of the sacrificial layer 170. Then, impurities are doped with the second silicon layer 20 by an ion implantation process. For example, the second silicon layer 20 may be formed using polysilicon.

Next, as shown in FIG. 11, the second silicon layer 20 is patterned to form a back plate 130 and a back plate pad 136. Further, when forming the back plate 130, dimple holes 134 may be further formed, whereas acoustic holes 132 (see FIG. 2) may not be formed. A portion of the sacrificial layer 170 corresponding to the dimple holes 134 may be etched to make the dimples 144 (see FIG. 2) to protrude downwardly from a lower surface of the back plate 130.

Figure 12:
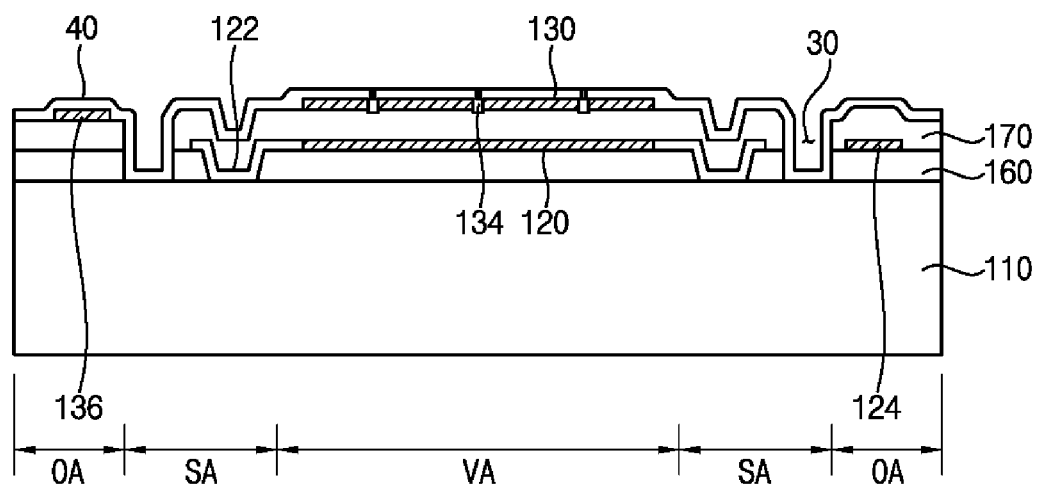
Figure 13:
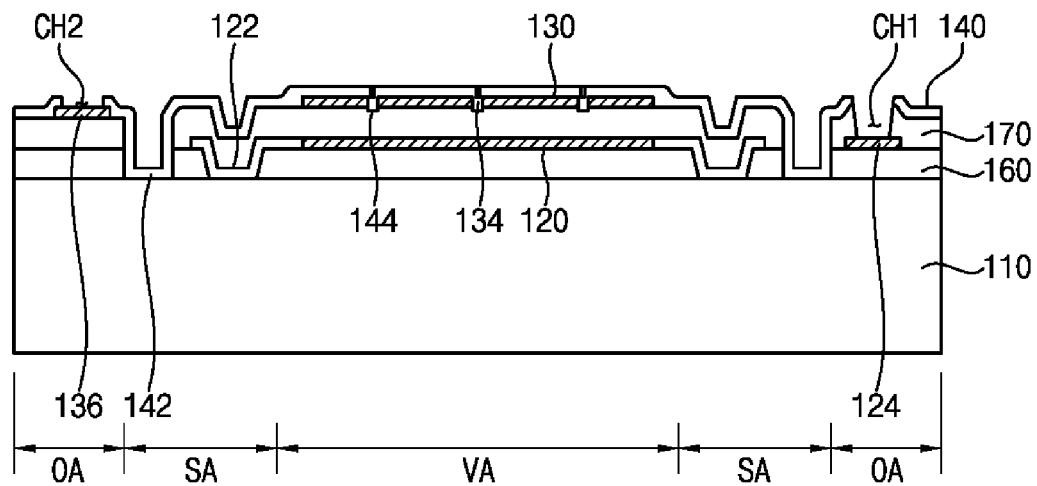

Referring to FIGS. 5, 12 and 13, the sacrificial layer 170 and the lower insulation layer 160 are patterned to form a strut hole 30 in the supporting area SA for forming a strut 142 (see FIG. 2) (Step S140). The strut hole 30 may partially expose the substrate 110.

After an insulation layer 40 is formed on the sacrificial layer 170 having the strut hole 30, the insulation layer 40 is patterned to form an upper insulation layer 140 and the strut 142, as shown in FIG. 13 (Step S150). Further, the dimples 144 may be further formed in the dimple holes 134 and a second contact hole CH2 is formed to expose the back plate pad 136. Furthermore, both a portion of the insulation layer 40 and a portion of the sacrificial layer 170, positioned over the diaphragm pad 124, are removed to form a first contact hole CH1.

In an example embodiment, the insulation layer 40 may be formed using a material different from those of the lower insulation layer 160 and the sacrificial layer 170. For example, the insulation layer 40 is formed using silicon nitride or silicon oxynitride, whereas the lower insulation layer 160 and the sacrificial layer 170 are formed using silicon oxide.

Figure 14:
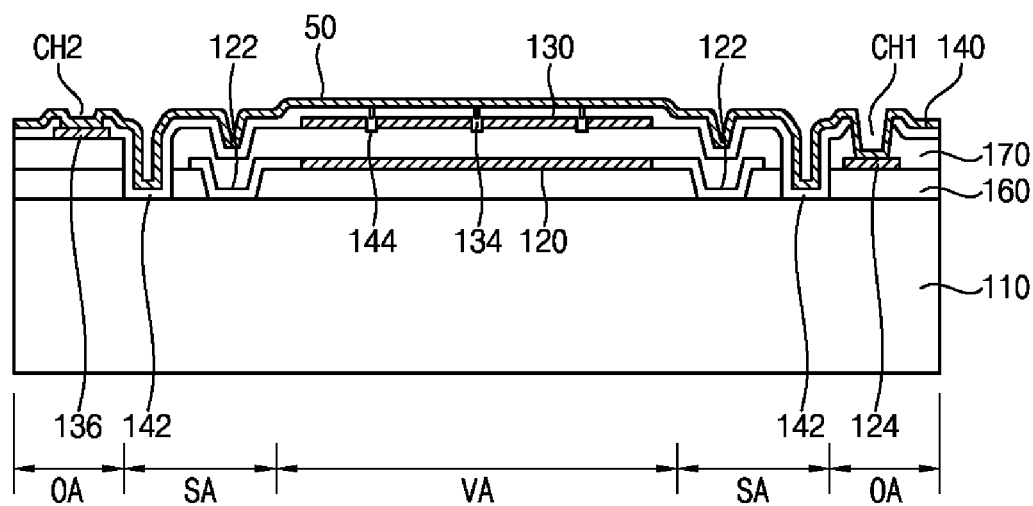
Figure 15:
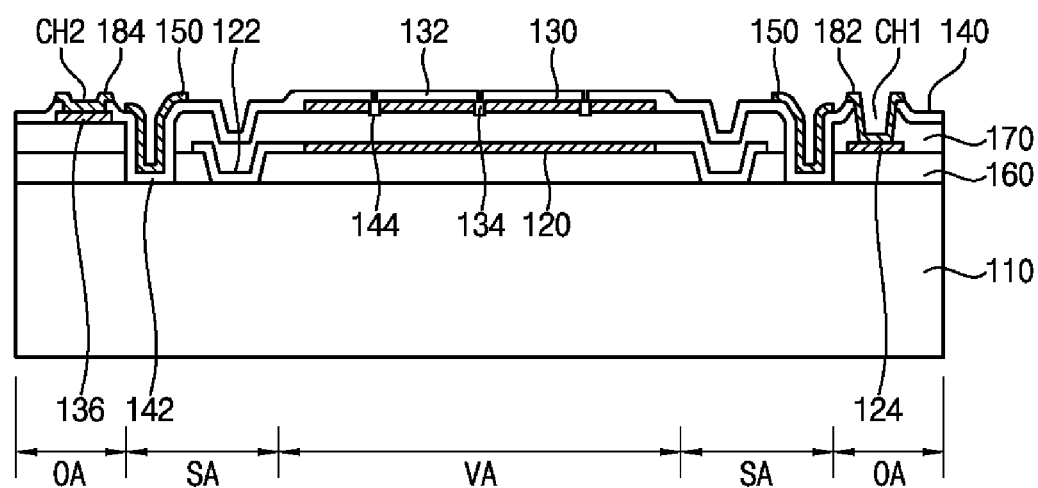

Referring to FIGS. 5, 14 and 15, after forming the first and the second contact holes CH1 and CH2, a thin film 50 is formed over the substrate 110, as shown in FIG. 14 (step S160). In an example embodiment, the thin film 50 may be formed using a material having a tensile force larger than that of the upper insulation layer 140. For example, the thin film 50 is formed using a conductive metal such as aluminum.

Next, the thin film 50 is patterned to form a bending prevention member 150, a first pad electrode 182 and a second pad electrode 182, as shown in FIG. 15 (Step S170).

Figure 16:
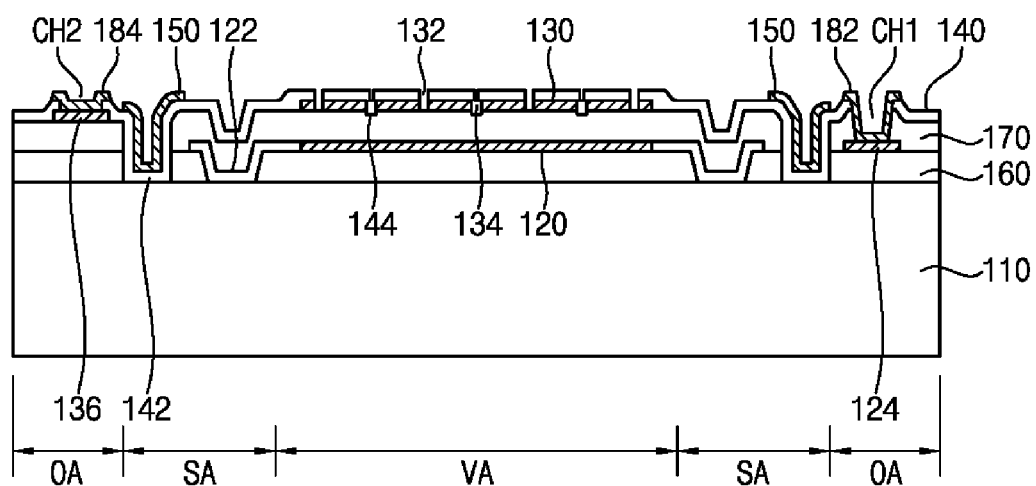

Referring to FIGS. 5 and 16, the upper insulation layer 140 and the back plate 130 are patterned to form acoustic holes 132 in the vibration area VA (step S180).

Figure 17:
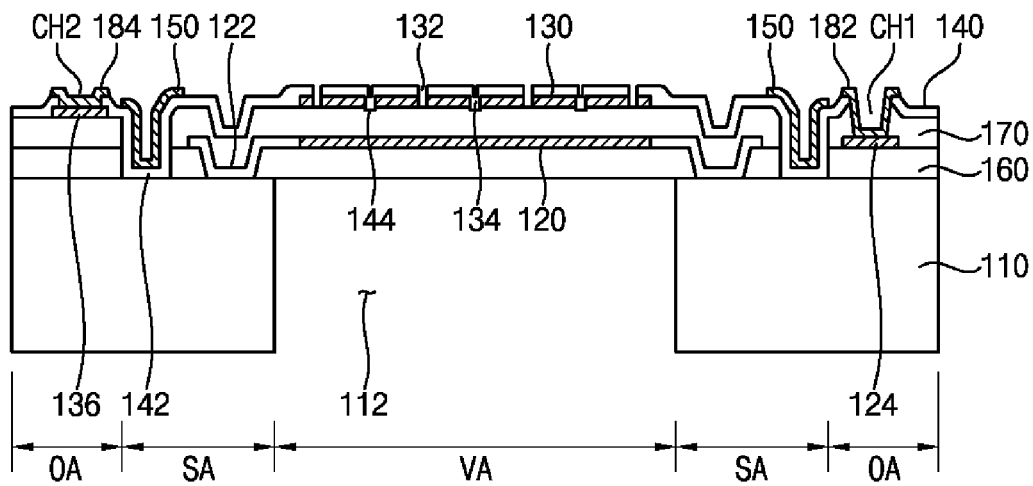

Referring to FIGS. 2, 5, and 17, after forming the acoustic holes 132, the substrate 110 is patterned to form a cavity 112 in the vibration area VA (step S190). Thus, a portion of the lower insulation layer 150 is exposed through the cavity 112.

Portions of the sacrificial layer 170 and the lower insulation layer 160, corresponding to the vibration area VA and the supporting area SA are removed through an etching process using the cavity 112 and the acoustic holes 132 (Step S210). Thus, the diaphragm 120 is exposed through the cavity 112, and an air gap AG is formed. Further, portions of the lower insulation layer 160, positioned between the anchors 122 adjacent to each other, are removed to form a passage SP (see FIG. 4) for the acoustic wave to flow. As a result, the MEMS microphone 100 as shown in FIG. 2 is manufactured.

In an example embodiment of the present invention, a hydrogen fluoride vapor (HF vapor) may be used as the etchant for removing the sacrificial layer 170 and the lower insulation layer 160. Further, the strut 142 may function as a barrier to prevent the etchant from flowing into the peripheral area OA.

As described above, according to example embodiment of the method of manufacturing a MEMS microphone of the present invention, the bending prevention member 150 may be formed together with the first and second pad electrodes 182 and 184. Thus, the bending prevention member 150 may be formed without additional process. Also, since the back plate 130 can be prevented from being bent owing to the bending prevention member 150, the thickness of the upper insulation layer 140 may be thinner than the conventional one. As a result, the process margin can be improved, the process time can be shortened, and the manufacturing cost can be reduced.

Figure 18:
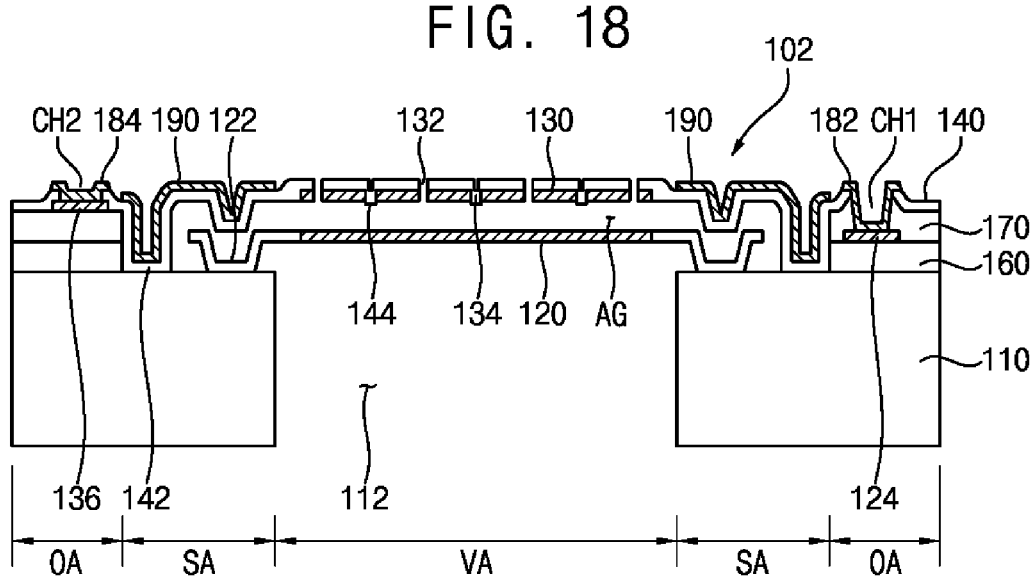
FIG. 18 is a cross sectional view illustrating a MEMS microphone in accordance with an example embodiment of the present invention.

FIG. 18 is a cross sectional view illustrating a MEMS microphone in accordance with an example embodiment of the present invention.

Referring to FIG. 18, the MEMS microphone 102 according to the third embodiment of the present invention has the same configuration as the MEMS microphone 101 shown in FIG. 1 except for the bending prevention member 190. Therefore, in the following description on the MEMS microphone 102, the same elements as those of the MEMS microphone 101 shown in FIG. 1 are designated by the same reference numerals, and a duplicate description will be omitted.

The MEMS microphone 102 may include the bending prevention member 190. The bending prevention member 190 is provided to prevent the back plate 130 from being bent.

The bending prevention member 190 is located in the support region SA and may be disposed along the strut 142. The bending prevention member 190 may include a material having a tensile stress higher than that of the upper insulation layer 140 to prevent the back plate 130 and the upper insulation layer 140 from sagging.

The bending prevention member 190 may cover a portion of the upper surface of the upper insulation layer 140 and an upper surface of the strut 142. Particularly, the bending prevention member 190 may cover a portion of the upper surface of the upper insulating layer 140 that is located between the strut 142 and the back plate 130 to be positioned over the anchors 122. That is, the anchors 122 may be formed in a U-shape in vertical section. Accordingly, a portion of the upper insulation layer 140, located over the anchors 122 may be bent in a U-shape as shown in FIG. 18. In particular, the warpage of the upper insulation layer 140 may occur mainly at bent portions of the upper insulation layer 140, for example, a connecting portion where the upper insulating layer 140 and the strut 142 are connected to each other, and a bending portion corresponding to a shape of the anchors 122. The bending prevention member 190 may cover the connecting portion as well as the bend portion formed along the shape of the anchors 122, the bending prevention member 190 may prevent the insulation layer 140 and the back plate 130 from being bent more effectively than the bending prevention member 150 shown in FIG. 2 does.

In an embodiment of the present invention, the bending prevention member 190 may be made of a conductive material. In addition, the bending prevention member 190 may be made of a metal material, for example, aluminum. The bending prevention member 190 may be disposed on the same layer as the first and second pad electrodes 182 and 184 and may be formed of the same material as the first and second pad electrodes 182 and 184. In addition, the bending prevention member 190 may be formed together with the first and second pad electrodes 182 and 184 in the process of manufacturing the MEMS microphone 102.

Although the MEM microphone has been described with reference to the specific embodiments, they are not limited thereto. Therefore, it will be readily understood by those skilled in the art that various modifications and changes can be made thereto without departing from the spirit and scope of the appended claims.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112(f) of 35 U.S.C. are not to be invoked unless the specific terms "means for" or "step for" are recited in a claim.

What is claimed is:

1. A MEMS microphone comprising:
    a substrate having a cavity;
    a back plate disposed over the substrate and defining a plurality of acoustic holes therein;
    a diaphragm disposed between the substrate and the back plate, the diaphragm being spaced apart from the substrate and the back plate, covering the cavity, and configured to generate a displacement corresponding to an applied acoustic pressure;
    an upper insulation layer covering the back plate and holding the back plate to space the back plate from the diaphragm to form an air gap between the back plate and the diaphragm;
    a strut being provided at a peripheral area of the diaphragm and having a lower surface making contact with an upper surface of the substrate to support the upper insulation layer and to space the upper insulation layer from the diaphragm;
    a bending prevention member disposed on the strut to prevent the back plate from being bent, the bending prevention member having a "U" vertical sectional shape;
    a second pad electrode to be electrically connected to the back plate, the second pad electrode being formed from the same layer as the bending prevention member; and
    at least one anchor extending from an end portion of the diaphragm and integrally formed with the diaphragm, the at least one anchor having a lower surface making contact with the upper surface of the substrate to support the diaphragm,
    wherein the at least one anchor comprises a plurality of anchors spaced apart from each other to be arranged along a periphery of the diaphragm, and an empty space is formed between anchors and adjacent to the plurality of anchors to provide a passage through which the applied acoustic pressure can be transmitted.

2. The MEMS microphone of claim 1, wherein the bending prevention member has a tensile stress substantially higher than that of the upper insulation layer.

3. The MEMS microphone of claim 1, wherein the bending prevention member is made of a metal material such as aluminum.

4. The MEMS microphone of claim 1, wherein the bending prevention member covers both an upper surface of the strut and also a connection portion connecting the strut to the upper insulation layer.

5. The MEMS microphone of claim 4, wherein the bending prevention member further covers a portion of an upper surface of the upper insulation layer, corresponding to a position located between the strut and the back plate.

6. The MEMS microphone of claim 1, wherein the strut is spaced from the diaphragm, and the strut has a ring shape to surround the diaphragm.

7. The MEMS microphone of claim 6, wherein the bending prevention member has a ring shape to extend along an outer periphery of the strut.

8. The MEMS microphone of claim 1, wherein the strut is positioned at an outer side of the plurality of anchors, and the plurality of anchors are positioned below the bending prevention member.

9. The MEMS microphone of claim 1, further comprising:
    a lower insulation layer pattern located on the substrate, arranged below the upper insulation layer and at an outer side of the strut, the lower insulation layer pattern made of a different material than the upper insulation layer;
    a diaphragm pad disposed on the lower insulation layer pattern and connected to the diaphragm;
    a sacrificial layer pattern interposed between the lower insulation layer pattern and the upper insulation layer and disposed at the outer side of the strut, the sacrificial layer pattern made of a different material than the upper insulation layer;
    a back plate pad located on the sacrificial layer pattern and connected to the back plate; and
    a first pad electrode disposed on the upper insulation layer to be electrically connected to the diaphragm pad, the first pad electrode being formed from the same layer as the bending prevention member.

10. The MEMS microphone of claim 1, wherein the diaphragm includes a doped portion disposed at a position corresponding to the back plate.

11. A MEMS microphone comprising:
    a substrate having a cavity, the substrate being divided into a vibration area, a supporting area surrounding the vibration area and a peripheral area surrounding the supporting area;
    a diaphragm disposed over the vibration area of the substrate to cover the cavity, the diaphragm being spaced apart from the substrate, and being configured to generate a displacement with responding to an acoustic pressure;
    a back plate disposed over the diaphragm and in the vibration area, the back plate having a plurality of acoustic holes;
    an upper insulation layer covering the back plate and holding the back plate to space the back plate from the diaphragm to form an air gap between the back plate and the diaphragm;
    a strut arranged in the supporting area and at an outer side of the diaphragm, the strut extending from an end portion of the upper insulation layer toward the substrate to support the upper insulation layer;
    a bending prevention member disposed in the supporting area to cover an upper surface of the strut, the bending prevention member having a tensile stress substantially higher than that of the upper insulation layer to prevent the back plate from being bent, the bending prevention member having a "U" vertical sectional shape;
    a second pad electrode to be electrically connected to the back plate, the second pad electrode being formed from the same layer as the bending prevention member; and
    at least one anchor extending from an end portion of the diaphragm and integrally formed with the diaphragm, the at least one anchor having a lower surface making contact with an upper surface of the substrate to support the diaphragm,
wherein the at least one anchor comprises a plurality of anchors spaced apart from each other to be arranged along a periphery of the diaphragm, and an empty space is formed between anchors and adjacent to the plurality of anchors to provide a passage through which the acoustic pressure can be transmitted.

12. The MEMS microphone of claim 11, wherein the bending prevention member covers an upper surface of the strut and a connection portion of connecting the strut to the upper insulation layer.

13. The MEMS microphone of claim 11, further comprising at least one anchor extending from an end portion of the diaphragm toward the substrate to support the diaphragm.

14. The MEMS microphone of claim 11, further comprising:
   a diaphragm pad disposed in the peripheral area and connected to the diaphragm;
   a back plate pad located in the peripheral area and connected to the back plate; and
   a first pad electrode disposed on the upper insulation layer to be electrically connected to the diaphragm pad.

15. A method of manufacturing a MEMS microphone, comprising:
   forming a lower insulation layer and a diaphragm sequentially on a substrate being divided into a vibration area, a supporting area surrounding the vibration area, and a peripheral area surrounding the supporting area;
   forming a sacrificial layer on the lower insulation layer to cover the diaphragm;
   forming a back plate on the sacrificial layer and in the vibration area;
   patterning the sacrificial layer and the lower insulation layer to form a strut hole in the supporting area for forming a strut;
   patterning an insulation layer formed on the sacrificial layer to form an upper insulation layer holding the back plate and the strut supporting the upper insulation layer;
   forming a thin film on the upper insulation layer and the strut, the thin film having a tensile stress higher than that of the insulation layer;
   patterning the thin film to form a bending prevention member covering an upper surface of the strut;
   patterning the back plate and the upper insulation layer to form a plurality of acoustic holes which penetrate through the back plate and the upper insulation layer;
   patterning the substrate to form a cavity in the vibration area; and
   performing an etching process using the cavity and the acoustic holes to remove portions of the sacrificial layer and the lower insulation layer, located at positions corresponding the vibration area and the supporting area.

16. The method of claim 15, wherein the bending prevention member covers an upper surface of the strut and a connection portion connecting the strut to the upper insulation layer.

17. The method of claim 15, wherein forming the lower insulation layer and the diaphragm sequentially comprises forming a first silicon layer on the lower insulation layer, and patterning the first silicon layer to form the diaphragm in the vibration area and a diaphragm pad in the peripheral area and connected to the diaphragm,
   forming the back plate comprises forming a second silicon layer on the sacrificial layer, and patterning the second silicon layer to form the back plate in the vibration area and a back plate pad in the peripheral area connected to the back plate, and
   forming the bending prevention member comprises forming patterning the thin film to form the bending prevention member in the supporting area, a first electrode pad on the diaphragm pad, and a second electrode on the back plate pad.

18. The method of claim 17, wherein, prior to forming the first silicon layer, forming the lower insulation layer and the diaphragm sequentially comprises patterning the lower insulation layer to form an anchor hole in the supporting area for forming an anchor, and
   forming the diaphragm and the diaphragm pad comprises patterning the first silicon layer to form the anchor in the supporting area to support the diaphragm.

* * * * *